United States Patent [19]
Gaudet

[11] Patent Number: 6,035,409
[45] Date of Patent: Mar. 7, 2000

[54] 1000 MB PHASE PICKER CLOCK RECOVERY ARCHITECTURE USING INTERLEAVED PHASE DETECTORS

[75] Inventor: Brian Gaudet, San Jose, Calif.

[73] Assignee: National Semiconductor Corporation, Santa Clara, Calif.

[21] Appl. No.: 09/080,448

[22] Filed: May 18, 1998

[51] Int. Cl.[7] .................................................. G06F 1/12
[52] U.S. Cl. ........................ 713/401; 713/503; 713/600
[58] Field of Search .................................. 713/400, 401, 713/503, 600

[56] References Cited

U.S. PATENT DOCUMENTS

| | | | |
|---|---|---|---|
| 5,374,860 | 12/1994 | Llewellyn | 327/276 |
| 5,754,835 | 5/1998 | Lin et al. | 713/401 |
| 5,802,103 | 9/1998 | Jeong | 375/220 |
| 5,864,250 | 1/1999 | Deng | 327/165 |
| 5,945,860 | 8/1999 | Guay et al. | 327/246 |

*Primary Examiner*—Dennis M. Butler
*Attorney, Agent, or Firm*—Limbach & Limbach LLP

[57] ABSTRACT

A clock recovery architecture for recovering clock and serial data from an incoming data stream provided by a node of a local area network. A phase picker architecture augmented by a phase interpolator is used as part of the clock recovery architecture to enhance phase resolution. The present invention uses interleaved phase detectors to recover a 125 mhz clock and 10 bit rxd vector from a 1000 mb (1.25 Ghz embedded clock) serial input data stream. The inventive architecture can be used to recover clock and data from any high frequency data stream (provided that embedded clock is such that a narrow band CRM suffices), using a low frequency CGM to provide multiple clock phases for CRM.

1 Claim, 4 Drawing Sheets

Vout / Vin = (sCR2 + 1) / sCR1 pole at zero (ideal integrator)
zero at 1/ (CR2)

atten_p = R1 / R2     (attenuation of proportional control)
atten i = CR1     (attenuation of phase error affecting integrator level)

integrator_depth = C

1000 MB PHASE PICKER CLOCK RECOVERY ARCHITECTURE USING INTERLEAVED PHASE DETECTORS

TECHNICAL FIELD

The present invention is directed to local area networks, and more specifically, to a clock recovery architecture based on interleaved phase detectors which can be used to recover data from a 1000 mb data stream. The use of a phase picker type clock recovery module in conjunction with a phase interpolator provides a savings in power consumption and area and permits the integration of multiple clock recovery channels onto a single die.

BACKGROUND OF THE INVENTION

Local area networks (LAN) utilize a clock recovery scheme to extract a clock signal from the data transmitted between stations over the network. The recovered clock signal is then used to properly synchronize the operations performed on the incoming data, e.g., sampling and decoding of the data.

As data rates for local area networks increase, the clock recovery module (CRM) used to recover clock and data from the incoming data stream increases in power consumption and area. For example, on a 0.35 um, 3V process, a currently available 10BT CRM requires 150 sq mils area and draws about 6 mW of power. A currently available 100BX CRM requires about 1.5K sq mils area, and draws about 50 mW of power. Based on these requirements, a 1000BX CRM would be very hard to implement with such a process.

Current 1000BX CRM's are based on BiCMOS processes, which are expensive and draw a lot of power (1 W is typical for currently available 1000BX CRMs). The large power consumption makes integration of multiple clock recovery channels onto a single die extremely difficult, and makes integration of a clock recovery channel with an application specific integrated circuit (ASIC) unattractive. This is a significant limitation because integration of multiple CRM's onto a single die would make fully integrated gigabit repeaters, buffered distributors and switches possible.

This problem has been addressed by the use of clock recovery modules using interleaved phase detectors. For example, to recover 1000 mb data (a 1.25 mhz embedded clock), a 15 phase voltage controlled oscillator (VCO) operating at 250 mhz could be used. Three consecutive VCO phases would be compared to every 5th bit of data in such a way that all bits are compared to a phase (i.e., phase 1-3 compared to 1st bit, phase 4-6 to 2nd, . . . , phase 13-15 to 5th, phase 1-3 to 6th, etc.). Five phase detectors are used, with three input phases per phase detector. Phases 1-3 sample a data bit, and phase information and recovered data are extracted. Prior approaches have then used a charge pump per phase detector to create five charging/discharging currents to modify the control voltage of a single filter. The filter voltage is then used to adjust the VCO frequency, bringing the 15 VCO phases into phase with the input data stream transitions. A data aligner circuit brings the five recovered data streams in phase with each other, and one of the VCO phases is used as the recovered clock. This provides a 5-bit wide vector of recovered data with a 250 mhz RXC.

The above explanation describes a specific case of how an interleaved phase detector CRM can recover an Xmhz clock from a data stream using 3*N phases of a Ymhz VCO clock, where X/Y=N. One prior solution ("A 622 Mb CMOS Clock Recovery PLL with Time-Interleaved Phase Detector Array", ISSCC96 Session 12/Serial Data Communications) reports power consumption of 200 mW and an area of 1100 sq mils using a 5V, 0.8 um process. Another prior solution ("A 0.8 um CMOS 2.5 Gb/s Oversampled Receiver for Serial Links", ISSCC96/SESSION12) reports power consumption of 1 W and an area of 14K sq mils.

A phase picker clock recovery architecture has been used to increase the phase resolution of a recovered clock signal. A phase picker architecture adjusts the phase of the recovered clock in response to a filtered phase error detected by a phase detector, which compares the phase of the recovered clock signal with the incoming data. The phase of the recovered clock signal is then adjusted by selecting a different phase of N available phases provided by a clock generation module. An N:1 phase multiplexer is used to perform the phase selection. A phase picker clock recovery loop of a given order has essentially the same response as a VCO based clock recovery loop of that order plus one.

Advantages of a phase picker type loop include: loop parameters are independent of PVT, the CRM is totally digital, it allows sharing of multiple CRM's among a single CGM.

What is desired is an apparatus for recovering a clock signal from a transmitted data stream using a single clock recovery channel capable of operating at a 1000 mb/sec data rate to extract a clock signal from the data transmitted between two stations or nodes of a local area network, and which reduces the surface area and power required for currently available architectures.

SUMMARY OF THE INVENTION

The present invention is directed to a clock recovery architecture for recovering clock and serial data from an incoming data stream provided by a node of a local area network. A phase picker architecture augmented by a phase interpolator is used as part of the clock recovery architecture to enhance phase resolution. The present invention uses interleaved phase detectors to recover a 125 mhz clock and 10 bit rxd vector from a 1000 mb (1.25 Ghz embedded clock) serial input data stream. The scope of the invention is not limited to this application, as the inventive architecture can be used to recover clock and data from any high frequency data stream (provided that embedded clock is such that a narrow band CRM suffices), using a low frequency CGM to provide multiple clock phases for CRM.

Further objects and advantages of the present invention will become apparent from the following detailed description and accompanying drawings which set forth an illustrative embodiment in which the principles of the invention are utilized.

DETAILED DESCRIPTION OF THE INVENTION

A clock generation module/clock recovery module (CGM/CRM) architecture in accordance with the present invention is motivated by the need for a low surface area and power consumption solution for a 1000 mb physical layer of a local area network. This solution is designed to allow the integration of a number of CRM's onto a single die, making possible fully integrated gigabit repeaters, buffered distributors, and switches.

Figure 1:
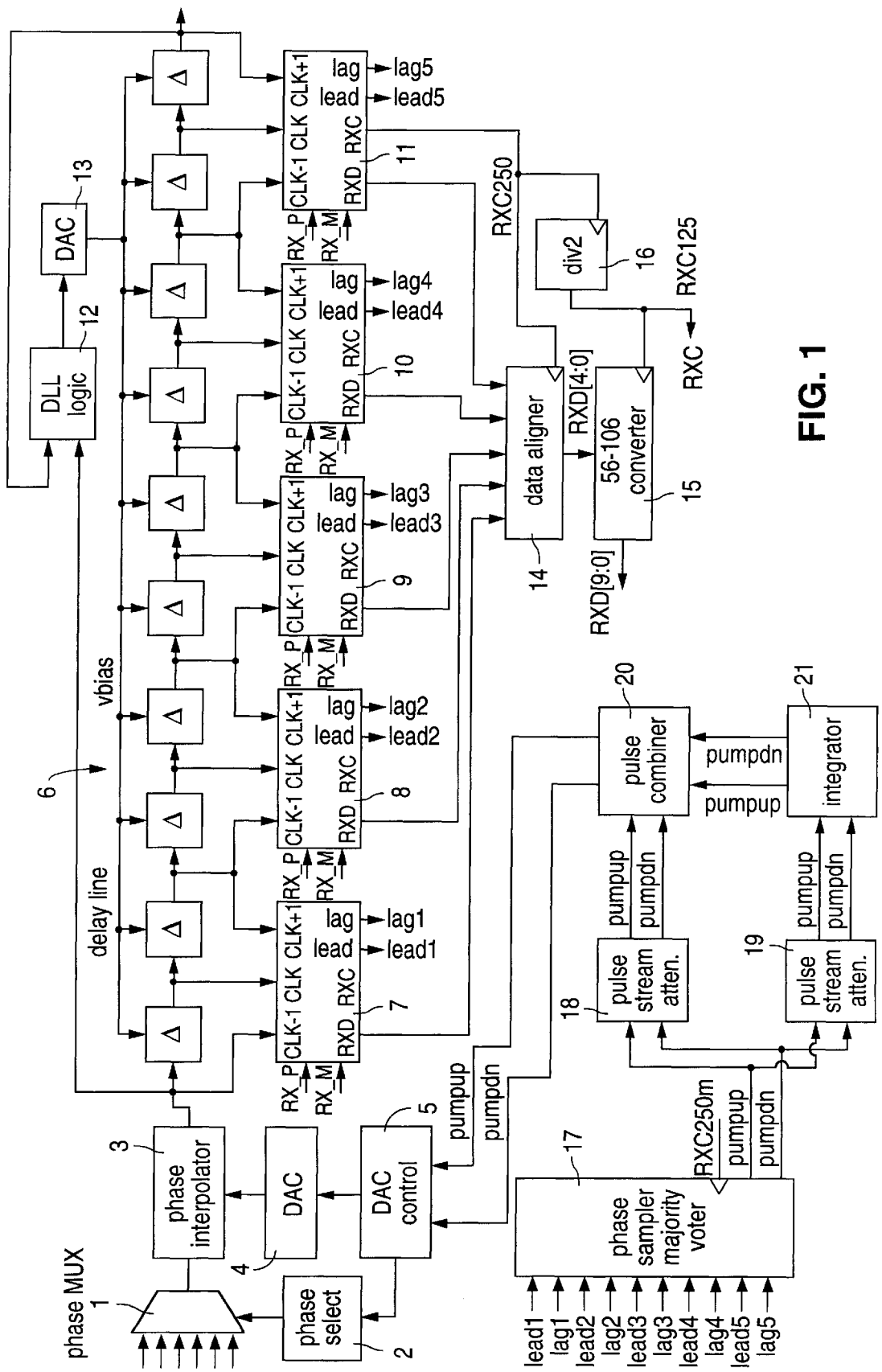
FIG. 1 is a block diagram illustrating a 1000 mb clock recovery module in accordance with the present invention.

FIG. 1 shows a 1000 mb clock recovery module in accordance with the present invention. Delay line 6 is controlled by delay-locked loop (DLL) logic 12 and a digital-to-analog converter (DAC) 13 to produce a total delay of 4 ns from one end to the other end of the delay line 6. The input to the delay line 6 comes from phase interpolator 3. In the embodiment shown in FIG. 1, delay line 6 includes 10 non-inverting precision delay elements. Outputs of the delay line 6 are used to provide inputs to phase detectors 7–11, with each phase detector (PD) using 3 phases from the delay line 6. The output phases of delay line 6 will be referred to as dl_phi[10:1] hereafter in this document. Phase detector PD1 uses dl_phi[3:1], with dl_phi[2] being used as a clock signal, dl-phi[1] as a clock advanced one phase, and dl_phi[3] as a clock retarded one phase. Phase detector PD2 uses dl_phi[5:3], with dl_phi[4] used as a clock signal, dl_phi[3] as a clock advanced one phase, and dl_phi[5] as a clock retarded one phase. The assignment of the other advanced, center, and retarded clock signals follows this pattern.

Phase detector PD1 through PD5 each extract phase error information from the incoming data stream RX-P, providing outputs lead and lag. In addition, data is recovered, providing output RXD. The retarded clock phase is buffered, providing an RXC output.

Figure 2:
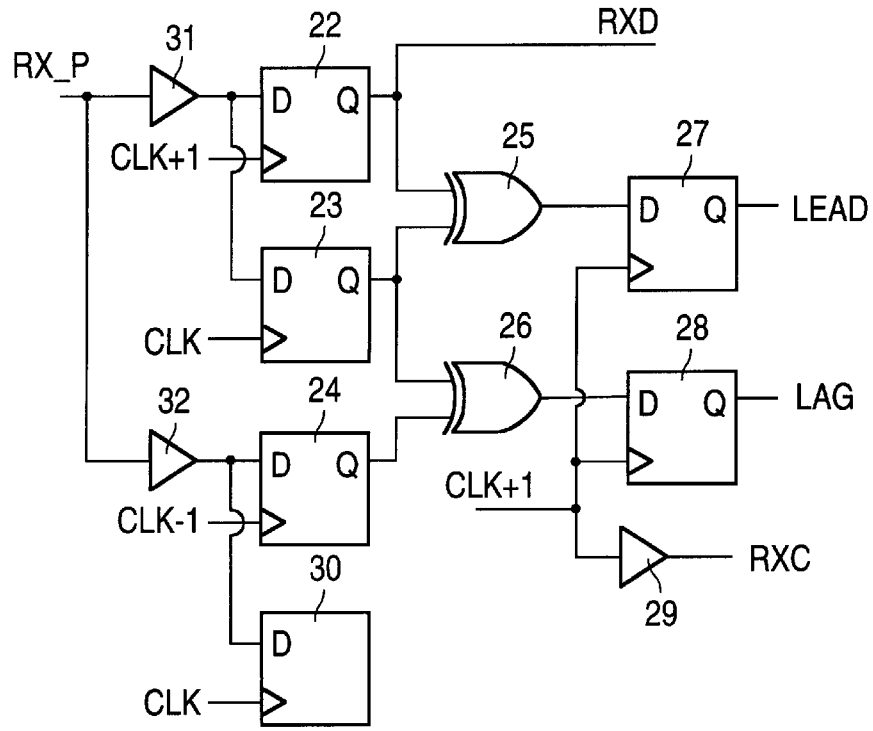
FIG. 2 is a block diagram illustrating a phase detector design utilizable in the FIG. 1 clock recovery module.
Figure 3:
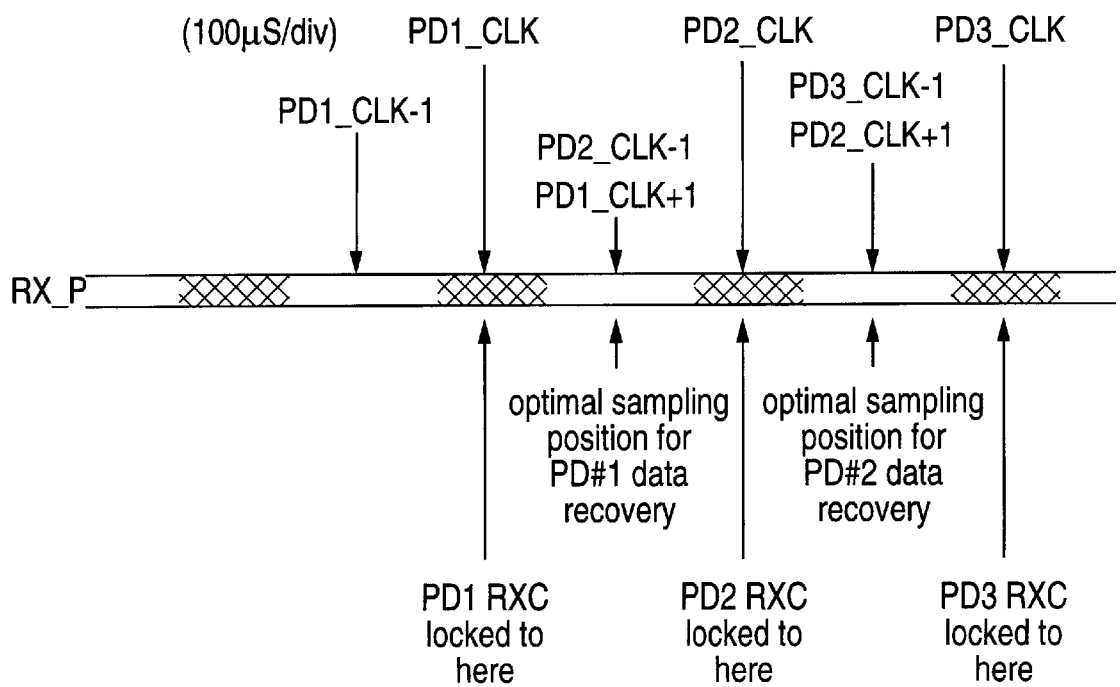
FIG. 3 provides a signal waveform illustrating interleaved phase detector operation in accordance with the present invention.

FIG. 2 is a block diagram of each phase detector (PD) shown in FIG. 1. As shown in FIG. 2, RX-P (the incoming data stream) is the D input to three special flip-flops 22–24. These flip-flops have a symmetric setup/hold window of <50 ps, and have equal input capacitance on the D and CLK inputs. Buffers 31 and 32 are used to give fast rise/fall times, with rise/fall times equal to CLK inputs. Flip-flop 30 is a dummy flop used since the delay line phases used as center clock inputs to the PD's only see one load, while the advanced and retarded phases are shared and see two loads.

If the CLK input is leading data (RX_P) input transition, the output of XOR gate 25 will be asserted high. If the CLK input is lagging data (RX_P) input transition, the output of XOR gate 26 will be high. The outputs of these XOR gates are sampled at the rising edge of CLK+1. This gives good setup and hold when the phase error is sampled using a common RXC. Note that when the CLK of PD is locked to the mean of jittered data input transitions, CLK+1 is an optimal sampling position to recover data.

Returning now to FIG. 1, the RXD outputs of phase detectors 7–11 are sampled in data aligner 14, using the RXC output of PD5 11. This provides data vector RXD[4:0], synchronous to RXC250 m, the RXC output of PD5 11. RXC250 m is divided down to RXC125 m in divide-by-2 16, where it is used in 5 bit to 10 bit converter 15 to provide the final output data vector RXD[9:0]. RXC125 m is the RXC output of the clock recovery channel.

The phase error signals from each PD (lead 1–lead 5 and lag 1–lag 5) are inputs to phase sampler and majority voter block 17. At each rising edge of RXC250 m, the phase error signals are sampled. If most of the phase errors are leading, then a leading signal is generated; if most are lagging, then a lagging signal is generated. Each sampling cycle that results in a lagging result will generate a pumpup pulse synced to RXC250 m, while a leading result will generate a pumpdn pulse synced to RXC250 m. The output pumpup/pumpdn stream is the input to pulse stream density attenuator 18, which only allows one of every N pulses to pass through, N being the desired amount of proportional attenuation. The output pumpup/pumpdn stream is also the input to pulse stream density attenuator 19, which attenuates the pulse density to integrator 21. Integrator 21 provides a pulse density modulated pulse stream output having a pulse density which is proportional to the past history of phase error. The operation of integrator 21 is described in greater detail below.

The pulse stream outputs from integrator 21 and attenuator 18 are combined in pulse stream combiner 20, where the output pulse streams are used to advance and retard the phase of the output of phase interpolator 3 and phase mux 1 in 40 ps increments. The operation of interpolator 3 is described in greater detail below.

Figure 4:
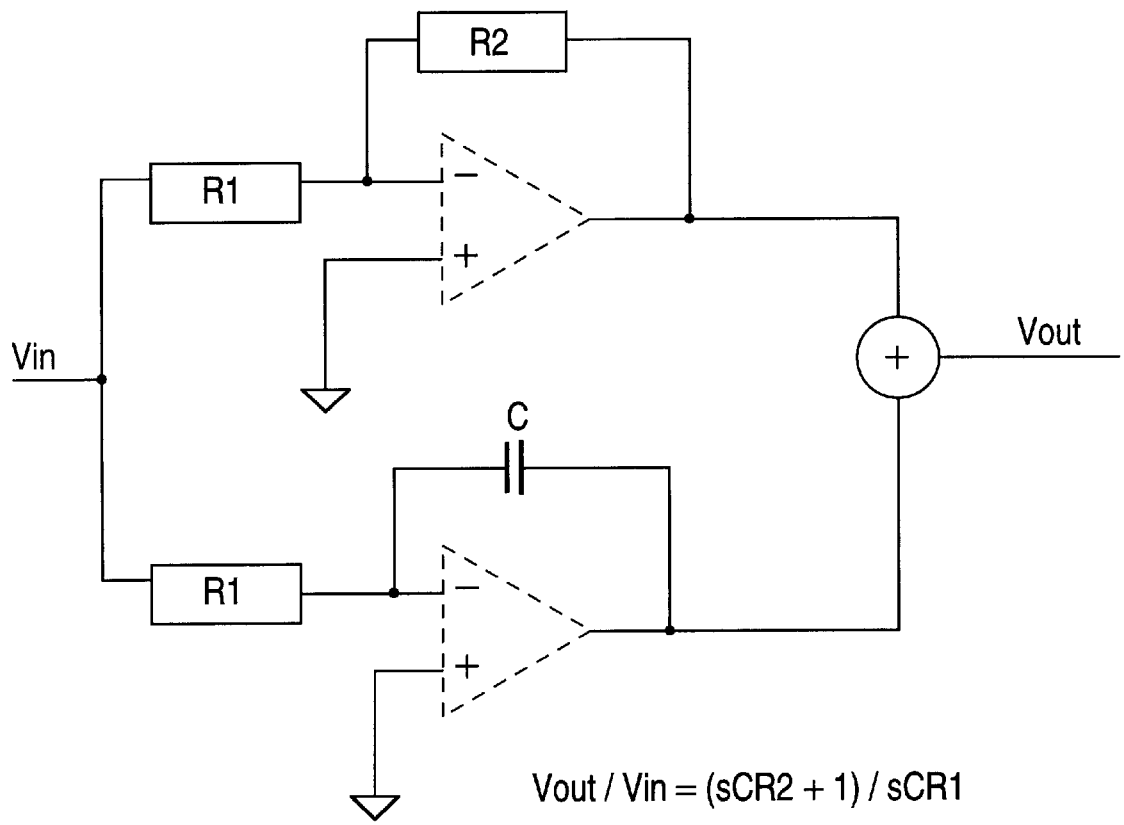
FIG. 4 is a block diagram illustrating an analog equivalent of a digital filter.

The above description completes the feedback loop, providing proportional and integral control that drives the phase error between RX_P transitions and the CLK input to each PD to zero. This allows optimal sampling of RX_P to recover RXD. The digital loop filter provides the same form of control as the analog filter shown in FIG. 4. Note that while the above discussion used a single ended CMOS level phase mux, interpolator, delay line, and PD, this could be implemented differentially.

Description of Integrator 21

Integrator 21 is an up/dn counter that increments on pumpup and decrements on pumpdn if the direction flop is set; otherwise, it decrements on pumpup and increments on pumpdn. Since pumpup and pumpdn pulse density are proportional to the phase error, the count value will be proportional to the past history of the phase error. If the counter is above zero and the direction flop is set, a pumpup is generated every N RXC's, where N is inversely proportional to the count. If the counter is above zero and the direction flop is zero, a pumpdn is generated every N RXC's (N inv. prop. to count).

In the absence of pumpups and pumpdns from proportional counters, which may happen in the case of an extended series of zeros or ones in the incoming data stream, the pumpup/dn signals from up/dn counter 21 will continue to compensate for the ppm delta between transmitting and receiving stations. The direction flop gets set when a pumpup occurs and count is zero, and gets reset when pumpdn occurs and count is zero. The depth of the integrator (number of bits in updn and RX counter) determines the limits and granularity of integral control. The minimum amount of integral control is when the updn counter is zero, and either a pumpup or pumpdn output pulse from integrator 21 is generated every N clocks, where $N=2^M$, where M is the integrator depth.

The integrator depth also effects lock time, as a deeper integrator will take longer to lock. The actual lock time is a function of both the integrator depth and the attenuation of proportional control. This digital filter architecture implements the same control in the feedback loop as the optimal analog loop filter of FIG. 4. Furthermore, it does this in a way that is more power and area efficient than DSP solutions.

Phase Multiplexer and Interpolator

The pumpup and pumpdn pulse streams from pulse combiner 20 are used to control a 16-bit shift register 5 (labelled "DAC control" in FIG. 1) in the following manner. Every pumpdown pulse causes the shift register to fill up with ones from the input. For example, if the shift register contained ff00, 2 pumpdown pulses would result in a value of fc0; from here, 3 pumpup pulses would result in a value of fc00. In other words, the pumpup pulses cause the ones to drain from the input. The value of the shift register is used to select a delay from 41.7 ps+constant delay to 667 ps+constant delay in delay interpolator 3. Each "1" in the shift register adds another 41.7 ps delay to the total delay. When shift register 5 contains all ones, and a pumpdown pulse is received, the shift register resets to 8000, and a pumpdown pulse is sent to phase mux phase selector 2. This causes the phase mux to select a phase retarded 667 ps from the current phase. For example, if current phase is phase 3, the phase mux would select phase 4. Since the delay selector 5 resets to 8000 at same time as the phase mux retards the phase by 667 ps, the net result is retarding the phase by 41.7 ps, same as if delay selector 5 received a pumpdown pulse when the value of delay selector was ff00 (or some value other than ffff), causing the delay selector to move to ff80. When shift register 13 contains 8000, and a pumpup pulse is received, the shift register resets to ffff, and a pumpup pulse is sent to phase mux phase selector 2. This causes the phase mux to select a phase advanced 667 ps from the current phase. For example, if current phase is phase 3, the phase mux would select phase 2. Since delay selector 5 resets to ffff at same time as the phase mux advances the phase by 667 ps, the net result is advancing the phase by 41.7 ps, same as if delay selector 5 received a pumpup pulse when the value of delay selector was ff00 (or some value other than 8000), causing the delay selector to move to fe00.

Phase mux 1 operates by a bidirectional shift register 2 shifting in response to pumpup and pumpdn pulses from delay selector 5. This shift register is 6 bits, with one and only one bit always true. The Q outputs of shift register 11 are used to enable transfer gates in the 6:1 mux 1. To insure glitchless switching, the total delay from rising edge of the clock inputs of shift register 2 to the rising edge of the same clock changing phase must be at least equal to the coarse phase step of 667 ps, and less than the 250 mhz clock high time. The six 250 mhz clock inputs to the phase mux come from the CGM. A single CGM provides 6 phases of 250 mhz to N phase muxes and N phase interpolators, one per receive channel.

A delay interpolator calibrator is used to provide a bias current to the delay interpolators such that the 16 phase steps span exactly one gross phase step out of phase mux.

A description of a phase multiplexer and interpolator architecture utilizable in conjunction with the present invention may be found in the U.S. Patent Application entitled "DLL Calibrated Switched Current Delay Interpolator", Attorney Docket No. NSC1-E1600, filed on the same date as this application; Application Attorney Docket No. NSC1-E1600 is hereby incorporated by reference in its entirety.

In terms of comparing the previously noted art to the present invention, the power is scaled down by a factor of 2.78 because simulation results of the new invention are done on a 3V process. Area is not scaled, since the bulk of the area of art solutions is taken up by the analog loop filter, which does not reduce in size with smaller processes. The data rate is also used to scale the consumed power. This gives a scaling factor of 1.6/2.78=0.6 for 622 mb CRM art, or a scaled power of 120 mW. A scaling factor of 1/(2.5*2.78)=1/7 is obtained for 2.5 Gb/sec art, or a scaled power of 143 mW.

Figure 5:
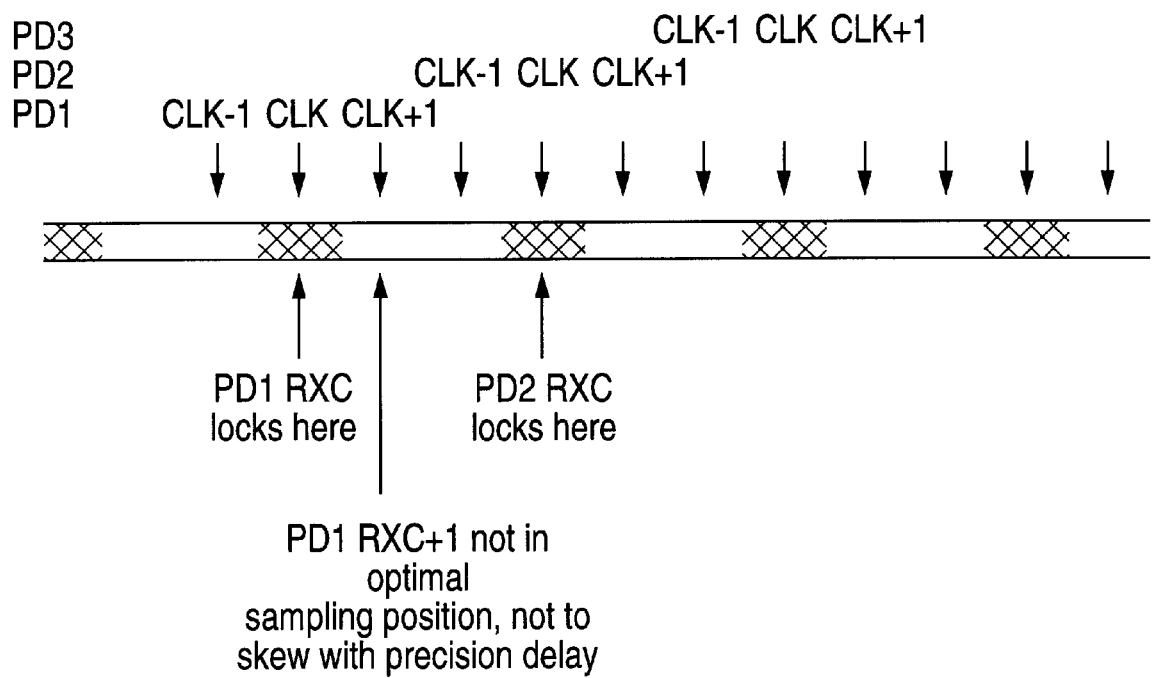
FIG. 5 provides a signal waveform illustrating prior art interleaved phase detector operation.

The present invention has many advantages over the existing art approaches. It can share multiple CRM channels amongst a single CGM. This saves area and power. Prior interleaved phase detector designs require a VCO per clock recovery channel. Phase detection/data recovery scheme requires 2x oversampling, while existing art required at least 3x. This reduces the required number of CGM phases by a factor of 3, with corresponding reduction in power and area, and the total required amount of phases by a factor of 1.5. The phase detector samples data in optimal sampling position without needing a precision delay, while existing art requires a precision delay per phase detector to achieve optimal sampling. This aspect is shown in FIG. 5. Since the CRM channel requires no charge pumps or analog loop filters, no resistors or capacitors are needed, and size scales directly with process. The loop filter runs at 250 mhz, saving power. Skew critical timing limited to phase mux, interpolator, and detector, meaning that digital filter can be implemented with standard cell logic, providing easy process portability. Loop dynamics are independent of PVT. It has very linear phase adjust vs. phase error characteristics; and 1 less pole than VCO based loops. The estimated channel area per CRM is 200 sq mils. The estimated power per CRM is 25 mW.

The above estimates assume a 0.35 um process, 3.6V max VCC, and does not include CGM power, which is shared among N CRM channels. It also does not include functions such as an equalizer, and 10/100 CRM channels.

Note that the present invention provides an improvement of 5x in power consumption over existing interleaved phase detector approaches, and 40x over non-interleaved PD approaches. This power improvement can be attributed to the need for less phases required for phase compare and data recovery, and the ability to share a single CGM among multiple channels. These features are a direct result of the inventive architecture.

The present invention provides an improvement of 5.5x over the existing approaches in terms of required area. This improvement can be attributed to the fact that the inventive architecture requires no resistors or capacitors, which don't scale in size with process geometry, and by the sharing of a single CGM among multiple channels, a direct result of the inventive architecture.

It is important to note the following important design parameters for the present invention: Phase jitter needs to be minimized in the CGM, phase interpolator, and delay line; Each delay line tap needs to be equally loaded; Metal runs need to be matched for CLK and RX_P inputs to PD's; and Some delay matching may be required to achieve setup/hold margin for the data aligner and phase sampler.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed.

What is claimed is:

1. A clock recovery circuit comprising:
   a series of delay elements controlled by a delay locked loop and a digital-to-analog converter such that each delay element produces a clock signal that is phase delayed from the previous delay element in the series by a defined phase difference;
   a phase interpolator that provides an input clock signal to the series of delay elements;
   a series of phase detectors that are interleaved such that the first phase detector in the series uses the incoming clock signal as a clock retarded one phase, the output of the first delay element as a clock signal and the output of the second delay element as a clock advanced one phase, the second phase detector in the series uses the output of the second delay element as a clock retarded one phase, the output of the third delay element as a clock signal and the output of the fourth delay element as a clock advanced one phase, this pattern of inputs from the delay elements being repeated for each of the phase detectors such that each phase detector provides a phase error output and a data output;

a data analyzer and converter that samples the data outputs from the phase detectors and provides a corresponding multi-bit recovered data vector;

a phase sampler and majority voter block that provides a pumpup/pumpdown pulse stream based upon the phase error outputs of the phase detectors; and a pulse density attenuator and integrator block that converts the pumpup/pumpdown pulse stream from the phase sampler and majority voter block to a pulse stream that is used to advance and retard the phase of the clock signal provided by the phase interpolator to the series of delay elements.

* * * * *